United States Patent
Yuuki et al.

(10) Patent No.: US 7,768,330 B2
(45) Date of Patent: Aug. 3, 2010

(54) LOGIC CIRCUIT

(75) Inventors: Fumio Yuuki, Fujimino (JP); Hiroki Yamashita, Hachioji (JP); Masayoshi Yagyu, Hanno (JP); Koji Fukuda, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/003,443

(22) Filed: Dec. 26, 2007

(65) Prior Publication Data
US 2008/0204100 A1 Aug. 28, 2008

(30) Foreign Application Priority Data
Feb. 27, 2007 (JP) ............... 2007-047407

(51) Int. Cl.
*H03K 3/00* (2006.01)
(52) U.S. Cl. ............... 327/201; 327/52; 327/65
(58) Field of Classification Search ........... 327/52, 327/57, 63–65, 20, 201, 200
See application file for complete search history.

(56) References Cited

U.S. PATENT DOCUMENTS

| | | | | |
|---|---|---|---|---|
| 4,990,799 A * | 2/1991 | Weiss | | 327/65 |
| 6,191,629 B1 * | 2/2001 | Bisanti et al. | | 327/202 |
| 6,774,721 B1 * | 8/2004 | Popescu et al. | | 330/253 |
| 2003/0185321 A1 * | 10/2003 | Harberts | | 375/349 |
| 2005/0093628 A1 * | 5/2005 | Chen | | 330/253 |
| 2006/0181348 A1 | 8/2006 | Dreps et al. | | |

FOREIGN PATENT DOCUMENTS

| | | |
|---|---|---|
| JP | 2003-283309 | 3/1997 |
| JP | 2005-142633 | 11/2003 |

* cited by examiner

*Primary Examiner*—Lincoln Donovan
*Assistant Examiner*—Ryan C Jager
(74) *Attorney, Agent, or Firm*—Stites & Harbison, PLLC; Juan Carlos A. Marquez, Esq

(57) ABSTRACT

For example, a gain control part and a common node control part are provided in a logic circuit including a data acquisition part that has a differential amplifier configuration and acquires a data input signal when a click signal is an "H" level and a latch part that latches a data output signal from the data acquisition part when the click signal is an "L" level. The gain control part is provided between common nodes of NMOS transistors in the differential amplifier and serves to make the gain of the differential amplifier higher in a high frequency band than in a low frequency band. When the clock signal is an "L" level, the common node control part serves to control an electrical charge so as to eliminate a potential difference between the common nodes. Thus, the transition time of the data output signal is speeded up and the setup margin is increased in the latch part. The above described technique can therefore speed up operations of various logic circuits such as a latch circuit.

6 Claims, 12 Drawing Sheets

US 7,768,330 B2

LOGIC CIRCUIT

CLAIM OF PRIORITY

The present application claims priority from Japanese application JP 2003-047407 filed on Feb. 27, 2007, the content of which is hereby incorporated by reference into this application.

FIELD OF THE INVENTION

The present invention relates to a logic circuit, particularly, to an effective technology applicable to logic circuits that are required to operate at higher speeds, such as a flip-flop circuit.

BACKGROUND OF THE INVENTION

For example, a differential amplifier circuit in which a first current control circuit and a second current control circuit are provided for one of differential transistors forming a pair and the other thereof and a gain compensation circuit including a capacitance and a resistance is provided between the sources of the differential transistors is disclosed in JP-A No. 2005-142633. While use of a field-effect transistor having a silicon-on-insulator (SOI) structure causes a reduction in gain in a high frequency band (AC kink effect)s due to a parasitic body resistance and a parasitic capacitance, use of a differential amplifier circuit as described above allows achievement of a nearly flat frequency characteristic even in a high frequency band.

Also, a receiver circuit in which a differential amplifier circuit including a gain compensation circuit similar to what is disclosed in JP-A No. 2005-142633 and an ordinary differential amplifier circuit including no such gain compensation circuit are coupled in a manner that these differential circuits share an input signal, an output signal, and a load resistance pair is disclosed in U.S. Patent Application Publication No. 2006/0181348. In this receiver circuit, individually controlling ON/OFF of the tail currents of these two types of differential circuits allows only either differential amplifier circuit to operate. Also, use of the common input terminal and output terminal allows selective use of the differential amplifier circuits according to the characteristic of the transmission line.

Further, a flip-flop circuit that includes a differential amplifier and a source follower circuit having one of the outputs of the differential amplifier as an input thereof and in which the source of the source follower circuit is coupled to a current source via a metal oxide semiconductor (MOS) transistor having the other output of the differential amplifier as an input thereof is disclosed in JP-A No. 2003-283309. This differential amplifier has a three-stage structure in which a MOS transistor for data input, a MOS transistor for clock input, and a current source are coupled from a high potential power supply toward a low potential power supply. Such a configuration sufficiently secures the output current of the source follower circuit, allowing the flip-flop circuit to operate at a higher speed.

SUMMARY OF THE INVENTION

For example, the data transfer speed is being drastically increased in the fields of communications and the like; therefore, communication servers, routers, and the like are required to have 10 Gbps-class performance. In order to meet such a performance requirement, it is necessary to speed up operations of a transmission buffer or a reception buffer that serves to pass transmission/reception signals. In this case, for example, it is considered to use a receiver circuit as described in U.S. Patent Application Publication No. 2006/0181348.

On the other hand, a signal received by a receiver circuit or the like undergoes desired processes in various logic circuits including a flip-flop circuit. These logic circuits are typically speeded up by reducing the wiring delay therebetween; therefore, it is not usually considered to speed up operations of the logic circuits themselves. For example, there is no particular problem in using such a technique to meet a 1 Gbps-class performance requirement; however, it may not be possible to meet a 10 Gbps-class performance requirement without speeding up operations of the logic circuits themselves.

FIGS. 10A and 10B show a configuration example of a logic circuit considered as a base of the present invention. FIG. 10A is a circuit diagram of a latch circuit and FIG. 10B is a circuit diagram of a flip-flop circuit using the latch circuit of FIG. 10A. A latch circuit DLT_C of FIG. 10A reflects the three-stage structure described in JP-A No. 2003-283309 and includes a data acquisition part (data buffer part) BF_C and a latch part LT_C. The data acquisition part BF_C includes MOS transistors M11 and M12 to which complementary data input signals Din and DinB are to be inputted, load resistances R1 and R2, a MOS transistor M15 whose drain is coupled to the common source of the M11 and M12, and a MOS transistor M17 that is coupled to the source of the M15. A clock signal CK is to be inputted to the gate of the M15. The M17 serves as a current source, and a constant-voltage signal VCS is to be inputted to the gate thereof.

The latch part LT_C includes a MOS transistor 13 having, as a gate input thereof, an inverted data output signal DoutB serving as the drain of the M11 and having, as a drain input thereof, a data output signal Dout serving as the drain of the M12 and a MOS transistor M14 having inverse coupling relations to those of the M13. The latch part LT_C also includes a MOS transistor M16 whose drain is coupled to the common source of the M13 and M14, and the above-mentioned MOS transistor M17 that serves as a current source and is coupled to the source of the M15 as well as the source of the M16. An inverted clock signal CKB is to be inputted to the gate of the M16.

In such a configuration, when the clock signal CK is an "H" level, the data acquisition part BF_C is activated due to the conduction of the M15; when the clock signal CK is an "L" level (when the inverted clock signal CKB is an "H" level), the latch part LT_C is activated due to the conduction of the M16. Thus, when the CK is an "H" level, the BF_C acquires the data input signals Din and DinB, and once the CK has turned into an "L" level, the latch part latches the acquired Din and DinB.

The flip-flop circuit DFF_C of FIG. 10B is a so-called "master-slave" flip-flop circuit in which an output of a master latch circuit DLT_Cm is to be inputted into a slave latch circuit DLT_Cs. The latch circuit DLT_C of FIG. 10A is applied to each of the DLT_Cm and DLT Cs. If data input signals D and DB are inputted into the DLT_Cm, data output signals Q and QB are obtained from outputs of the DLT_Cs.

The DLT_Cm and DLT-Cs operate reversely to each other with respect to the phases of the clock signals CK and CKB. Specifically, when the clock signal CK is an "H" level, the DLT_Cm acquires the data input signals D and DB and the DLT_Cs latches data input signals in the preceding cycle; when the clock signal CK is an "L" level, the DLT_Cm latches the data input signals D and DB and the DLT_Cs acquires the latched data. In other words, the flip-flop circuit DFF_C operates as a flip-flop of a falling edge trigger.

However, in the latch circuit DLT_C of FIG. 10A, the data acquisition part BF_C has a three-stage structure (for example, M11, M15, and M17). This increases the load, such as the series resistance and the capacitance, which may lengthen the rise time/fall time of the data output signals Dout and DoutB. Accordingly, if data is transferred between flip-flop circuits DFF_C as shown in FIG. 10B and another flip-flop circuit DFF_C, a large amount of setup time must be secured, which would prevent the flip-flop circuits from operating at higher speeds, as shown in FIGS. 11 and 12.

FIGS. 11A and 11B show data transfer between flip-flop circuits of FIG. 10B. FIG. 11A is a circuit diagram of these flip-flop circuits, and FIG. 11B is a waveform diagram showing an example of a timing waveform at such data transfer. In FIG. 11A, output data of a flip-flop circuit DFF_Ca having the configuration FIG. 10B is transferred to a DFF_Cb having the configuration FIG. 10B via a logic part LOG that performs a desired logical operation. Here, the data transfer cycle at this time is defined as Tc, and the timing margin left at this data transfer is defined as Tm. As shown in FIG. 11B, the Tm is obtained by $$Tm=Tc-(Tdj+Tcj+Ts+Th)$$

where Tdj is data jitter, Tcj is clock jitter, Ts is a setup time, and Th is a hold time. If the setup time Ts is taken in a large amount, the timing margin Tm is reduced, which would need to lengthen the data transfer cycle Tc accordingly.

FIGS. 12A and 12B show examples of an input waveform directed to the flip-flop circuit DFF_Cb of FIG. 11A. FIG. 12A is a diagram showing a waveform during a normal operation, and FIG. 12B is a diagram showing a waveform during a misoperation. As shown in FIG. 12A, when the clock signal CK is an "H" level, the master latch circuit DLT_Cm in the DFF_Cb of FIG. 11A acquires the data input signal Din transferred from the DFF_Ca of FIG. 11A via the LOG, and when the CK is an "L" level, it latches the Din.

At this time, if the data signal transferred from the DLT_Cs (slave) of the DFE_Ca serving as the front flip-flop circuit of FIG. 11A via the logic part LOG is delayed, the arrival of the data input signal Din at the DLT_Cm (master) of the DFF_Cb serving as the rear flip-flop circuit of FIG. 11A is delayed, thereby causing a lack of the setup time, as shown in FIG. 12B. Further, in this state, if the rise time/fall time of the data output signal Dout from the data acquisition part BF_C of the DLT_Cm (master) of the DFF_Cb is lengthened, there occurs a further lack of the setup time Ts. In this case, the threshold voltage may not be exceeded in the latch part LT_C of the DLT_Cm, which may cause a mislatch.

An advantage of the present invention is to speed up operations of various logic circuits such as a latch circuit. The above and other advantages and novel features of the present invention will be apparent from the description of this specification and the accompanying drawings.

A typical aspect of the invention disclosed in this application will be outlined below.

According to an aspect of the present invention, a logic circuit includes a data acquisition part that has a differential amplifier configuration and acquires a data input signal when a click signal is a first level, a latch part that latches an output of the differential amplifier when the click signal is a second level, and a gain control part inserted between common nodes of transistors forming a pair included in the differential amplifier. The gain control part serves to make the gain of the differential amplifier higher in a high frequency band than in a low frequency band. For example, the gain control part includes a resistance and a capacitance that are parallel-coupled.

As described above, providing the gain control part in the latch circuit including the data acquisition part and the latch part allows shortening of the rise time/fall time of an output of the differential amplifier with respect to a data input signal in a high frequency band. This increases the setup margin in the latch part. As a result, operations of the logic circuit is speeded up.

The logic circuit according to the aspect of the present invention preferably further includes a common node control part that, when the clock signal is a second level, performs control such that a potential difference between the above-mentioned common nodes of the transistors forming a pair is eliminated by providing or drawing electrical charge to or from these common nodes.

When the clock signal turns into a second level, each common node is put into an open state. Therefore, for example, if the gain control part includes a capacitance, a potential difference may occur between the common nodes. Such a potential difference causes a misoperation in the latch part or causes an operation delay in the differential amplifier when the clock signal subsequently turns into a first level. Thus, providing the common node control part solves these problems, allowing the logic circuit to operate at a higher speed.

According to the typical aspect of the invention disclosed in this application, operations of the logic circuit are speeded up.

BRIEF DESCRIPTION OF THE DRAWINGS

Embodiments of the present invention will be described in detail with reference to the accompanying drawings, wherein:

FIG. 4A is a circuit diagram showing an example of changes in potential state of common nodes;

FIGS. 4B and 4C are diagrams showing an example of a problem caused by such changes;

FIG. 5A is a waveform diagram showing an example of an output waveform;

FIG. 5B is a waveform diagram showing an example of an operation of the latch circuit;

FIG. 7A is a circuit diagram showing a configuration example of the logic circuit according to the second embodiment;

FIG. 7B is a waveform diagram showing an operation example of FIG. 7A;

FIG. 10A is a circuit diagram of a latch circuit;

FIG. 10B is a circuit diagram of a flip-flop circuit using the latch circuit of FIG. 10A;

FIG. 11A is a circuit diagram showing the flip-flop circuits;

FIG. 11B is a waveform diagram showing an example of a timing waveform at such data transfer;

FIG. 12A is a waveform diagram showing the input waveform during a normal operation; and FIG. 12B is a waveform diagram showing the input waveform during a misoperation.

DETAILED DESCRIPTION OF THE PREFERRED EMBODIMENTS

Figure 1:
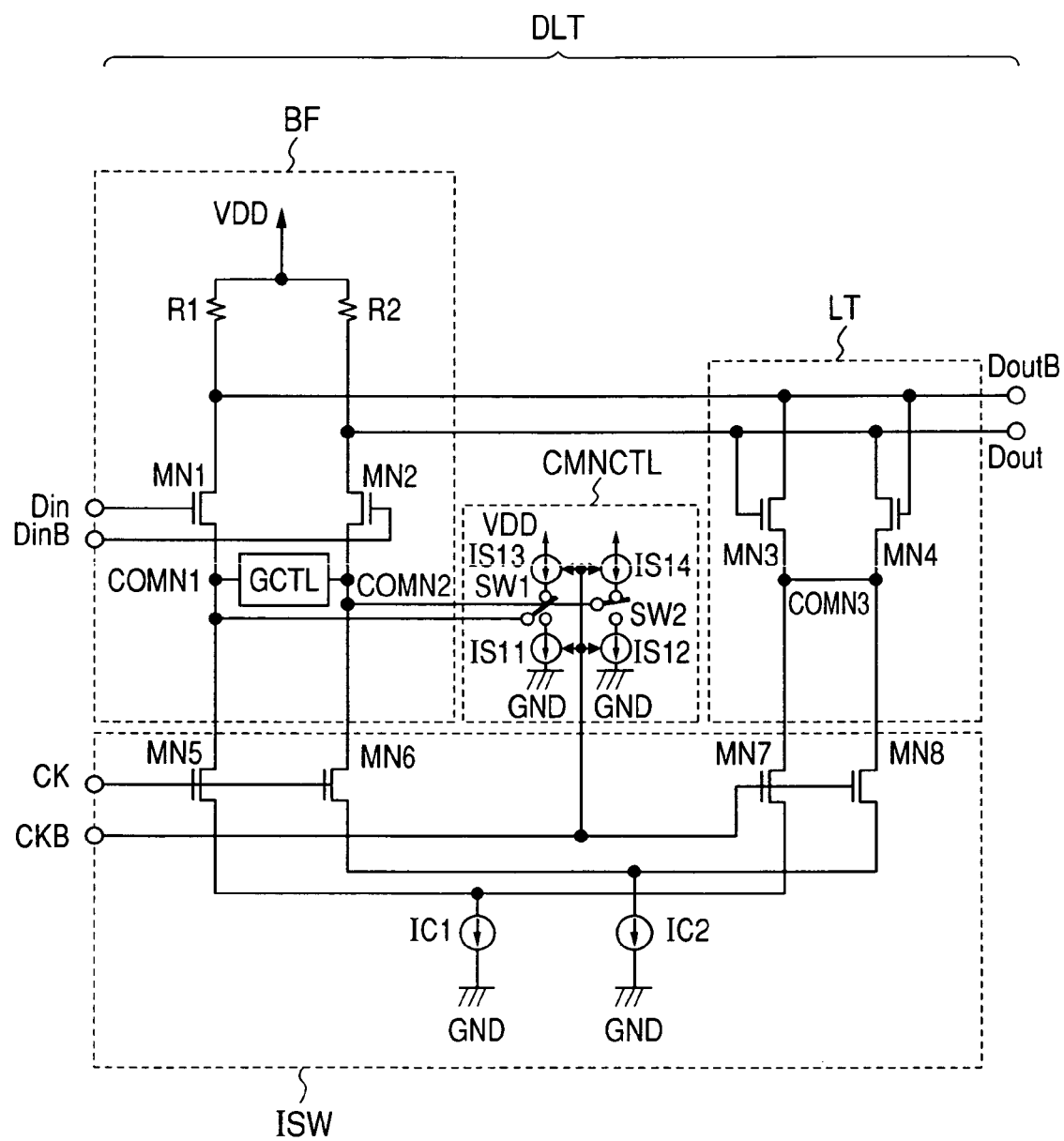
FIG. 1 is a circuit diagram showing a configuration example of a logic circuit according to a first embodiment of the present invention.

While the present invention will be described on the basis of multiple sections or embodiments as needed for convenience, these sections or embodiments are not unrelated to one another unless particularly specified, and are each a modification, a detail, a supplementary explanation, etc. of a part or all of others. If the number of components or the like (including the number of units, a numerical value, an amount, and a range) is mentioned in the following embodiments, the present invention is not limited to the mentioned number or the like except for cases in which the number or the like is particularly specified and cases in which the invention is apparently limited to the specific number or the like in terms of the principle, and may be more or less than the mentioned number. Like elements are given like reference numerals as a rule in all the drawings for describing the embodiments and will not repeatedly be described.

Circuit elements included in each functional block of the embodiments are formed on a semiconductor substrate made of monocrystalline silicon or the like using a known integrated circuit technology such as, but is not limited to, complementary MOS transistors (CMOS). In the embodiments, metal insulator semiconductor field effect transistors (MISFETs), particularly, metal oxide semiconductor (MOS) transistors are used as an example of transistors. In the relevant drawings, each p-channel type MOS transistor (PMOS transistor) is provided with a circular symbol so as to be distinguished from an N channel-type MOS transistor (NMOS transistor). There is no particular description of the connection of the substrate potential of the MOS transistors in the drawings. As long as the MOS transistors are normally operable, the connection method is not limited to any particular one.

First Embodiment

FIG. 1 is a circuit diagram showing a configuration example of a logic circuit according to a first embodiment of the present invention. The logic circuit shown in FIG. 1 is a latch circuit DLT and includes a data acquisition part (data buffer part) BD, a latch part LT, a common node control part CMNCTL, a current switching part ISW, and the like.

The data acquisition part BF has a differential amplifier structure and includes NMOS transistors MN1 and MN1, load circuits (load resistances) R1 and R2, and a gain control part GCTL. The gate of the MN1 is coupled to a data input node (data input signal) Din and the drain thereof is coupled to one end of the R1. The gate of the MN2 is coupled to an inverted data input node (inverted data input signal) DinB and the drain thereof is coupled to one end of the R2. The respective other ends of the R1 and R2 are coupled to a power supply voltage (power supply voltage node) VDD. The gain control part GCTL is provided between the a common node COMN1 serving as the source of the MN1 and a common node COMN2 serving as the source of the MN2. The GCTL has a function of making higher the gain of the differential amplifier with respect to a data input signal in a high frequency band than with respect to that in a low frequency band. This function will be described in detail later. Note that while the resistances are used as load circuits herein, these resistances may be replaced with PMOS transistors or the like.

The latch part LT includes NMOS transistors MN3 and MN4. The gate of the MN3 is coupled to the drain of the MN2, and the drain thereof to the drain of the MN1. On the other hand, the gate of the MN4 is coupled to the drain of the MN1, and the drain thereof to the drain of the MN2. The sources of the MN3 and MN4 are jointly coupled to the common node COMN3. Here, the drain of the MN1 serves as an inverted data output signal (inverted data output node) DoutB, and the drain of the MN2 as a data output signal (data output node) Dout. Thus, the latch part LT serves to latch these data output signals.

The current switching part ISW includes NMOS transistors MN5 to MN8 and constant-current circuits IC1 and IC2 whose respective ends are coupled to ground voltages (ground voltage nodes) GND. The gate of the MN5 is coupled to the clock node (clock signal) CK, the drain thereof to the COMN1, and the source thereof to the other end of the IC1. The gate of the MN6 is coupled to the CK, the drain thereof to the COMN2, and the source thereof to the other end of the IC2. The gate of the MN7 is coupled to the inverted clock node (inverted clock signal) CKB, the drain thereof to the COMN3, and the source thereof to the other end of the IC1. The gate of the MN8 is coupled to the CKB, the drain thereof to the COMN3, and the source thereof to the other end of the IC2.

Therefore, when the clock signal CK is an "H" level (when the inverted CKB is an "L" level), the data acquisition part BF is activated by coupling the IC1 and IC2 to the COMN1 and COMN2, respectively, so that the BF acquires the Din and DinB. On the other hand, the latch part LT is deactivated as the MN7 and MN8 are OFF. When the CK is an "L" level (when the CKB is an "H" level), the latch part LT is activated by coupling the IC1 and IC2 to the COMN3 so that the LT latches the pieces of data (that is, Dout and DoutB) acquired by the BF. On the other hand, the data acquisition part BF is deactivated as the MN5 and MN6 are OFF.

The common node control part CMNCTL serves to provide or draw a minute current to or from the common node COMN1 and COMN2 when the data acquisition part BF is deactivated. In other words, it serves as a route for providing or drawing slight electric charge to or from the common nodes COMN1 and COMN1. The CMNCTL here includes, for example, constant-current circuits IS11 to IS14 and switches SW1 and SW2. The constant-current circuits IS11 to IS14 are activated when the inverted clock signal CKB is an "H" level. The IS11 draws a current (electrical charge) from the COMN1 via the switch SW1, and the IS13 provides a current (electrical charge) to the COMN1 via the SW1. Similarly, the IS12 draws a current (electrical charge) from the COMN2 via the switch SW2, and the IS14 provides a current (electrical charge) to the COMN2 via the SW2.

The main features of the logic circuit according to the first embodiment that has the above-described configuration and operates as described above are that the gain control part GCTL is provided in the data acquisition part BF of the latch circuit DLT and that the common node control part CMNCTL is provided for the common nodes COMN1 and COMN2 serving as connection nodes of the GCTL. Although details will be described later, the setup margin is increased by providing the gain control part GCTL, and the potentials of the common nodes COMN1 and COMN2 are stabilized by providing the common node control part CMNCTL. These allow an increase in data transfer speed.

Figure 2:
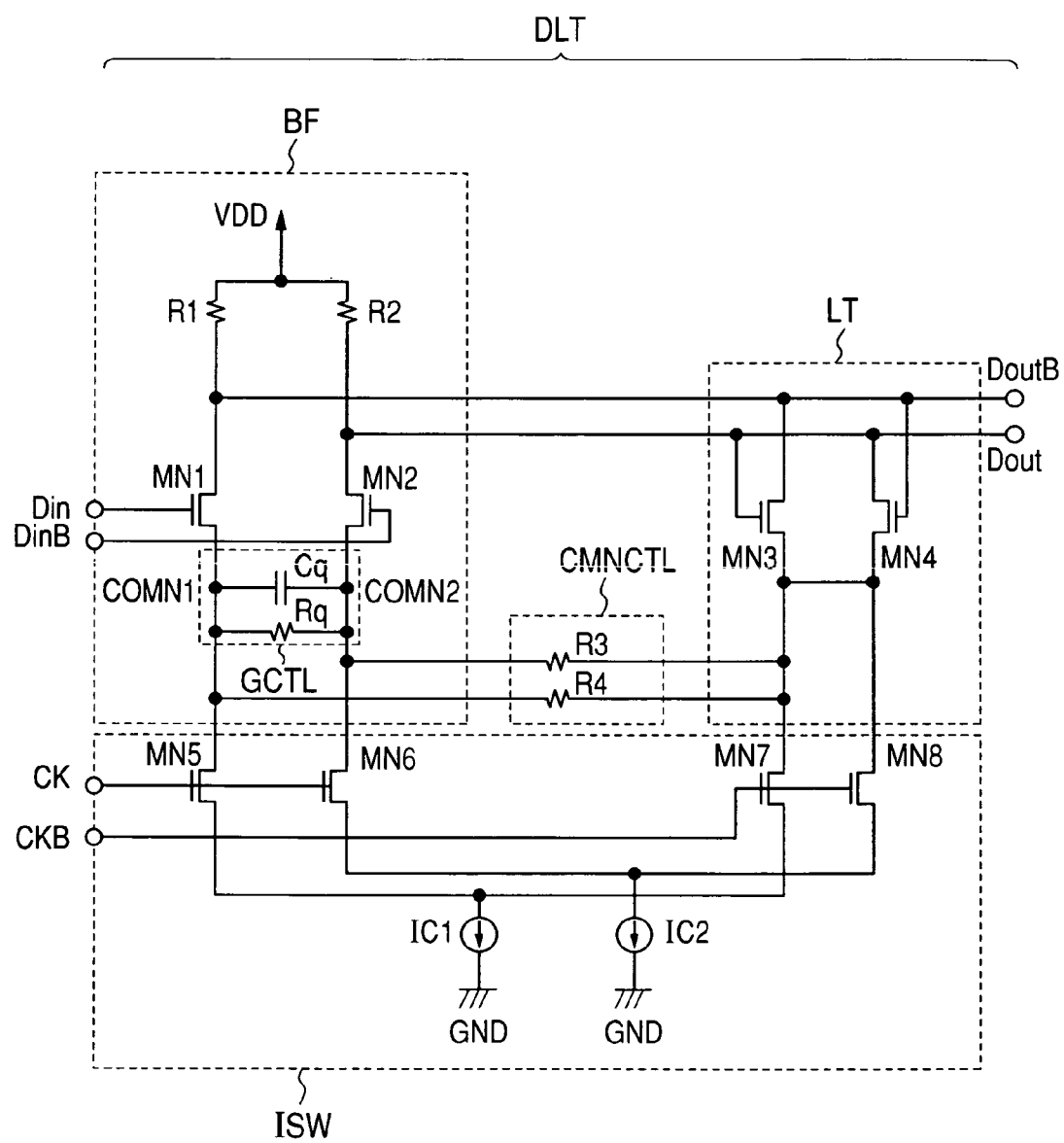
FIG. 2 is a circuit diagram showing a detailed configuration example of the logic circuit of FIG. 1.

FIG. 2 is a circuit diagram showing a detailed configuration example of the latch circuit of FIG. 1. The latch circuit DLT shown in FIG. 2 includes details of the gain control part GCTL and the common node control part CMNCT. The configuration except for the GCTL and CMNCT is similar to what is shown in FIG. 1 and will not be described in detail. In FIG. 2, the gain control part GCTL includes a capacitance Cq and a resistance Rq coupled in parallel between the common nodes COMN1 and COMN2. The common node control part CMNCTL includes a resistance R4 provided between the COMN1 and COMN3 and a resistance R3 provided between the COMN2 and COMN3. for example, resistances each having an identical high resistance value are used as the resistances R3 and R4.

Figure 3:
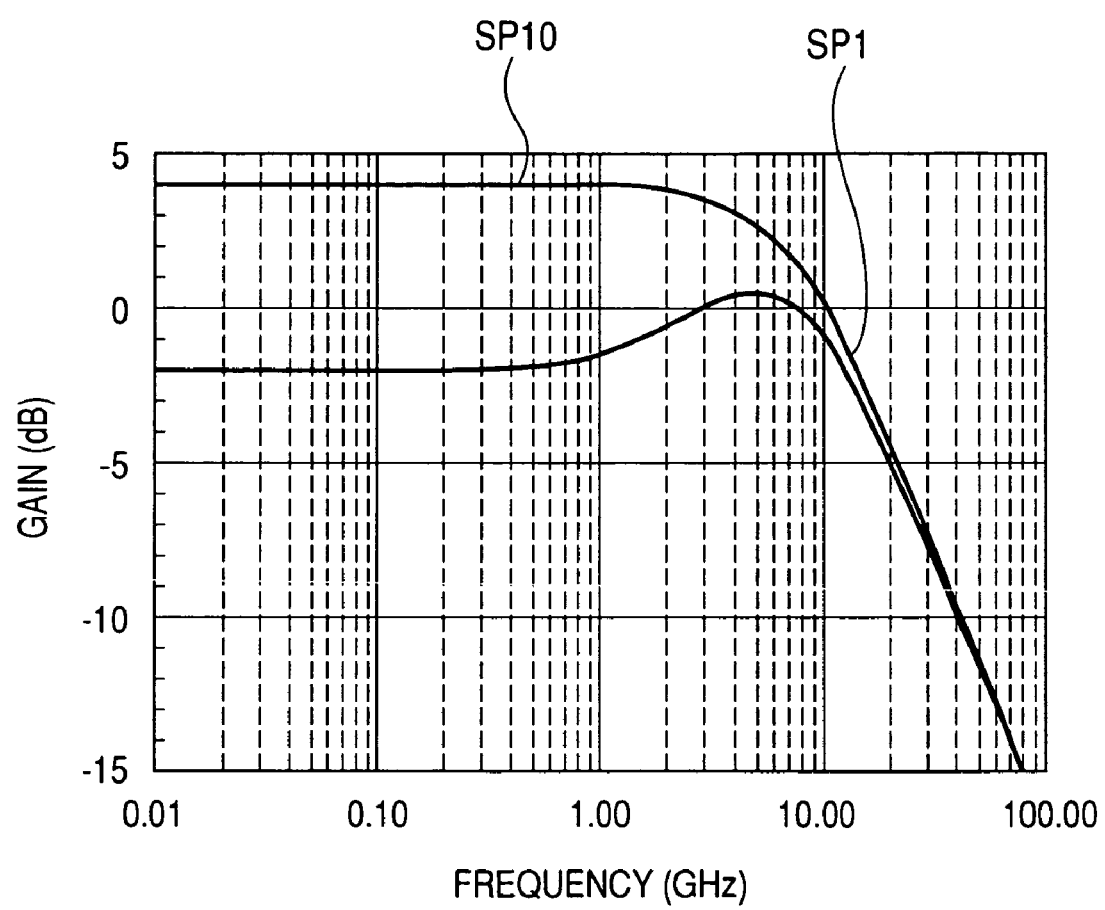
FIG. 3 is a graph showing a characteristic example of a data acquisition part including a gain control part of FIG. 2.

The data acquisition part BF exhibits, for example, the characteristic shown in FIG. 3 by providing the gain control part GCTL as described above. FIG. 3 shows a graph showing a characteristic example of the data acquisition part including the gain control part shown in FIG. 2. If the gain control part GCTL of FIG. 2 is provided, a gain G (jω) is obtained by Formula 1 using the values of the resistance Rq and the capacitance Cq in the GCTL.

Formula 1

$$G(j\omega) = \frac{Rd // \frac{1}{j\omega\, Cl}}{\frac{1}{Gm} + Rq // \left(\frac{1}{j2\omega\, Cq}\right)} \quad (1)$$

In Formula 1, Gm represents the mutual conductance of the MN1 (or MN2), Rd represents the resultant resistance value of the R1 (or R2) and the drain resistance of the MN1 (or MN2), Cl represents the load capacitance of an output, and ω represents the angular frequency, which is obtained from 2π where f represents the frequency, provided that the NMOS transistors MN1 and MN2 of FIG. 2 have an identical element characteristic and that the resistances R1 and R2 have an identical resistance value. In FIG. 3, a characteristic SP1 shows the relation between the gain G (jω) determined by Formula 1 and the frequency f, and a characteristic SP10 shows that in a case where the gain control part GCTL is not provided, for comparison.

As indicated by the characteristic SP10 of FIG. 3, if the gain control part GCTL is not provided, for example, the gain that is on the order of 4 dB in a low frequency band of 10 GHz or less starts to decrease from around 2 GHz and decreases to the order of 0 dB in a high frequency band of around 10 GHz. Therefore, if the latch circuit is operated according to an input signal of around 10 GHz, a distortion occurs in an output waveform due to the difference between the gain of components in the low frequency band and the gain of components in the high frequency band included in the input signal. This lengthens the rise time/fall time. On the other hand, as indicated by the characteristic SP1, if the gain control part GCTL is provided, the gain in the high frequency band is set to be larger than that in the low frequency band. Therefore, a gain equivalent to that in the low frequency band is secured even in the high frequency band of the order of 10 GHz. This allows a reduction in the distortion of the output waveform, as well as allows shortening of the rise time/fall time.

The characteristic SP1 of FIG. 3 will now be described. In the data acquisition part BF, a small-signal operation in which a small-signal current generated by one NMOS transistor (MN1 or MN2) flows toward the other NMOS transistor is performed. In this case, a small-signal current in a low frequency band mainly passes through the resistance Rq in the gain control part GCTL, while a small-signal current in a high frequency band mainly passes through the capacitance Cq in the gain control part GCTL. Therefore, the dissipation in the high frequency band is smaller than that in the low frequency band. As a result, a characteristic such as the characteristic SP1 is obtained. In the case of the characteristic SP1, the gain in the low frequency band is essentially smaller than that in the case of the characteristic SP10 due to the resistance Rq. If necessary, the difference between the gains may be compensated for such as by increasing the amplitudes of the data input signals Din and DinB.

As for FIGS. 1 and 2, a configuration is conceivable in which a common source is shared by the NMOS transistors MN5 and MN6 so as to be coupled to one constant-current circuit. However, if such a configuration is employed, a desired characteristic may not be obtained since a small-signal current passes through this common source, as is apparent from the qualitative operation of the above-mentioned characteristic SP1. From this regard, the two constant-current circuits IC1 and IC2 are preferably used. Further, in the configurations of FIGS. 1 and 2, the two NMOS transistors MN7 and MN8 are provided so that the two constant-current circuits IC1 and IC2 are also used by the latch part LT.

Figure 4A:
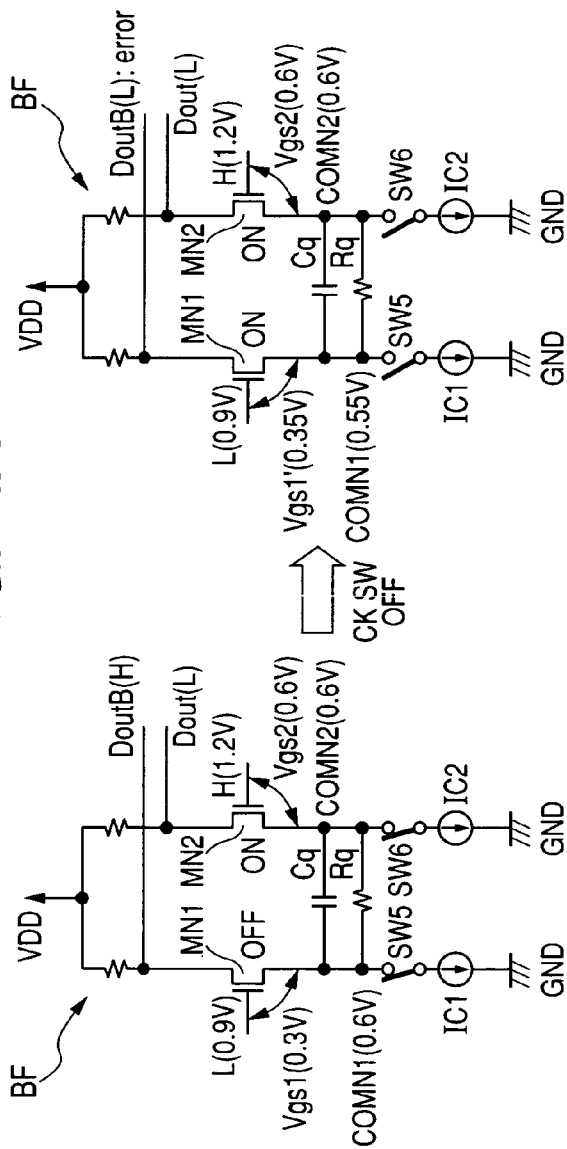
FIGS. 4A to 4C are diagrams showing the necessity of a common node control part of FIG. 2.
Figure 4C:
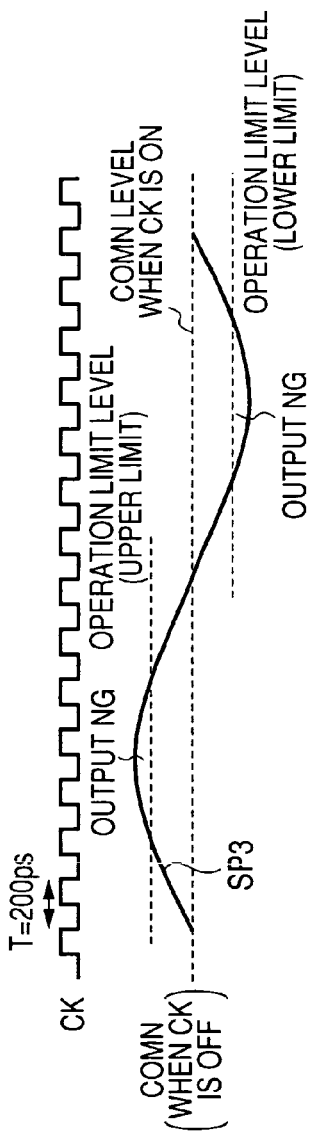
Figure 4B:
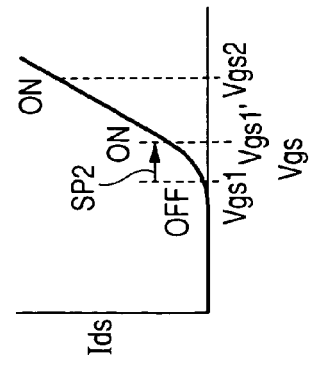

FIGS. 4A to 4C are diagrams showing the necessity of the common node control part. FIG. 4A is a circuit diagram showing an example of changes in the potential states of the common nodes and FIGS. 4B and 4C are diagrams showing an example of a problem caused by such changes shown in FIG. 4A. Specifically, FIG. 4A shows an example of the potential states of the NMOS transistors MN5 and MN6 (corresponding to switches SW5 and SW6 in FIG. 4A) in the data acquisition part BD at the time when these transistors are ON as the clock signal CK is an "H" level, and an example of the potential states of the SW5 and SW6 at the time when the SW5 and SW6 are OFF as the clock signal CK is an "L" level.

First, in a state in which an "L" level (e.g., 0.9 V) and an "H" level (e.g., 1.2 V) are inputted into the NMOS transistors MN1 and MN2, respectively, with the switches SW5 and SW6 being ON, the potentials of the common node COMN1 and COMN2 are each, for example, 0.6 V. That is, if there are no variations in the current values of the constant-current circuits IC1 and IC2 that are each set to an identical current value, the common nodes COMN1 and COMN2 also each have an identical potential. For example, assume that the threshold voltages of the MN1 and MN2 are both 0.3 V. In this state, the MN1 is ON (exactly, on the boundary between OFF and ON) and the MN2 is ON, and the inverted data output node DoutB is an "H" level and the data output node Dout is an "L" level.

Subsequently, when the switches SW5 and SW6 are turned OFF, the Dout and DoutB are latched by the latch part LT (not shown in FIGS. 4A to 4C). In this case, electrical charge carried via the MN2, which is ON, passes through the resistance Rq, causing a potential difference between the COMN1 and COMN2. The potential difference is maintained by the capacitance Cq. Thus, a situation is expected in which the potential of the COMN1 is made lower than that of the COMN2 for a while. Here, if the potential of the COMN1 decreases, for example, to 0.55 V, a gate-source voltage Vgs of the MN1 changes from Vgs1 (here, 0.3 V) to Vgs1' (here, 0.35 V), as indicated by the SP2 of FIG. 4B. Thus, the threshold voltage is exceeded and the MN1 is turned ON. As a result, the potential of the data output node DoutB decreases instantaneously. If that potential decreases to near an "L" level, a mislatch may occur in the latch part LT.

Further, when the switches SW5 and SW6 are ON, the MN1 and MN2 have different gate-source voltages Vgs according to the data input signal that is an "H" or "L" level. Thus, gate-source capacitances Cgs of the MN1 and MN2 also hold different amounts of electrical charge. Subsequently, when the switches SW5 and SW6 are turned OFF, electrical charge is distributed in a series circuit including the two capacitances Cgs and the capacitance Cq. This also causes a potential difference between the common node COMN1 and COMN2.

If a potential difference occurs between the common nodes COMN1 and COMN2 when the switches SW5 and SW6 are OFF, a mislatch may occur in the latch part LT as described above, or an amplification operation may be delayed when the switches SW5 and SW6 are subsequently turned ON. FIG. 4C conceptually shows such problems. When the clock signal CK is ON (when the switches SW5 and SW6 are ON), the levels (potential difference) of the common nodes COMN1 and COMN2 are a constant level (zero). Centering on this constant level, levels of the common nodes COMN1 and COMN2 serving as upper and lower operation limits exit. If the levels of the common nodes COMN1 and COMN2 change as indicated by the characteristic SP3 due to the above-mentioned factors when the clock signal CK is OFF (when the switches SW5 and SW6 are OFF), these levels may exceed the upper or lower limit level, thereby causing a misoperation.

Such a misoperation problem is solved by preventing occurrence of a potential difference between the common nodes COMN1 and COMN2 when the switches SW5 and SW6 are OFF. For this purpose, the common node control part CMNCTL of FIG. 1 performs control such that a potential difference between the COMN1 and COMN2 is eliminated by providing or drawing minute electric charge to or from each of the COMN1 and COMN2 by the constant-current circuits IS11 to IS14 when the inverted clock signal CKB is an "H" level (when the NMOS transistors MN5 and MN6 are OFF). Note that the amount of electrical charge to be provided or drawn must be the extent to which the data acquisition part BF is sufficiently kept in an inactive state.

The common node CMNCTL of FIG. 2 also has the same function as that of the CMNCTL of FIG. 1. The CMNCTL of FIG. 2 performs control such that a potential difference between the COMN1 and COMN2 is eliminated by coupling the amounts of electrical charge of the common nodes COMN1 and COMN2 to the constant-current circuit IC1 via the resistances R3 and R4 and the MN7 when the NMOS transistors MN7 and MN8 are ON (when the NMOS transistors MN5 and MN6 are OFF). Note that the resistances R3 and R4 each must have a high resistance value such that the data acquisition part BF is sufficiently kept in an inactive state and such that the resistances R3 and R4 have no effect on the tail current to the latch part LT.

Figure 5A:
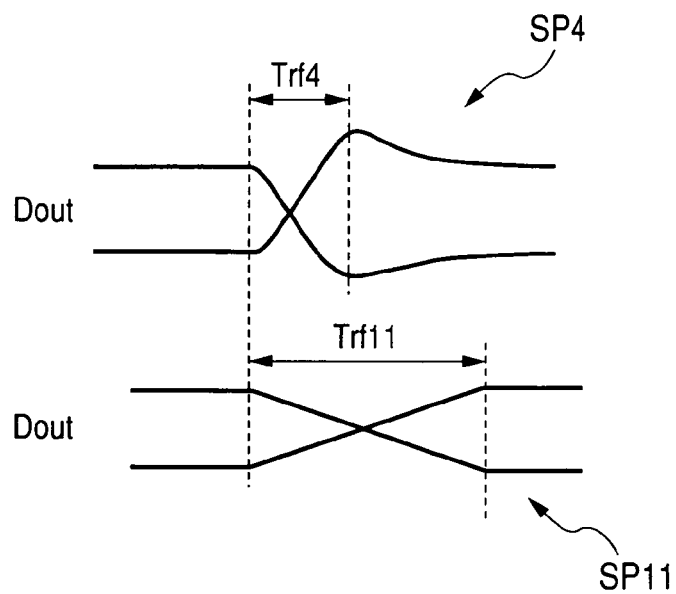
FIGS. 5A and 5B show an example of an advantage of the logic circuit according to the first embodiment.
Figure 5B:
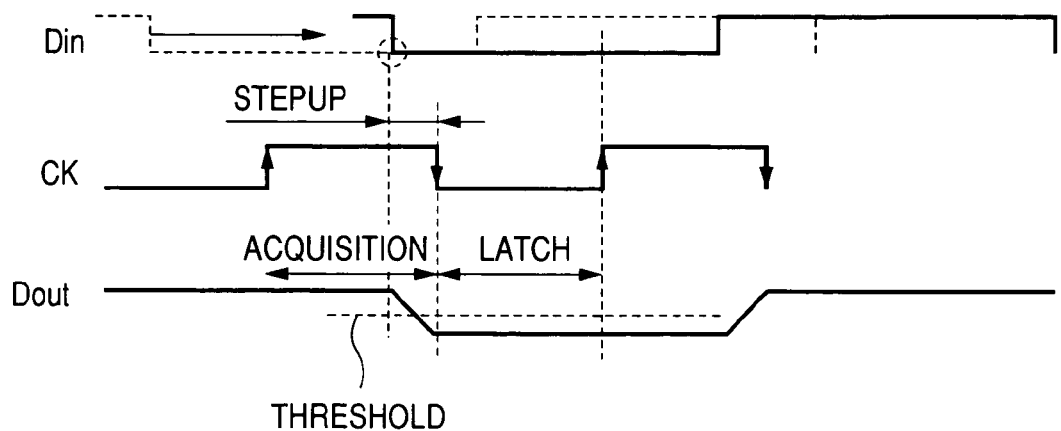

FIGS. 5A and 5B show an example of the advantage of the logic circuit according to the first embodiment. FIG. 5A is a waveform diagram showing an example of an output waveform and FIG. 5B is a waveform diagram showing an example of an operation of the latch circuit. For example, as indicated by a characteristic SP11 of FIG. 5A, a rise time/fall time Trf11 of the data output signal Dout is lengthened in the above-mentioned latch circuit DLT_C of FIG. 10A, which may cause a mislatch as described in FIG. 12B. On the other hand, as indicated by a characteristic SP4 of FIG. 5A, use of the latch circuit of FIG. 1 or FIG. 2 makes the rise time/fall time Trf4 of the Dout shorter than the Trf11.

Figure 12A:
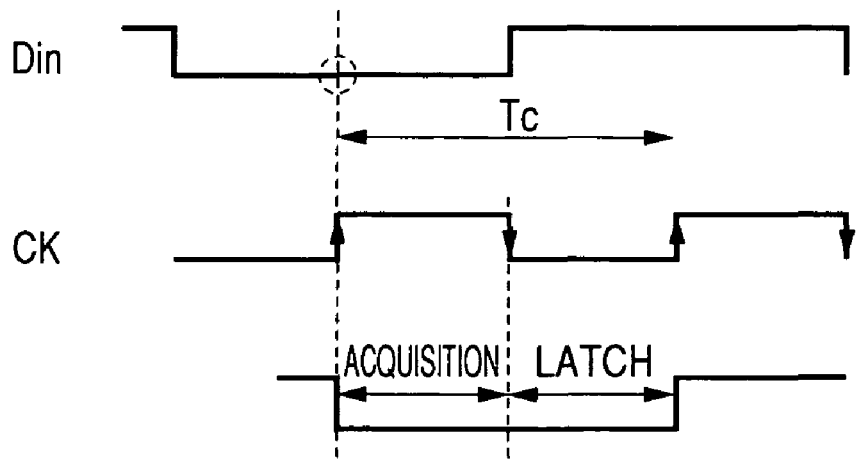
FIGS. 12A and 12B show an example of an input waveform directed to a flip-flop circuit DFF_Cb of FIG. 11A.
Figure 12B:
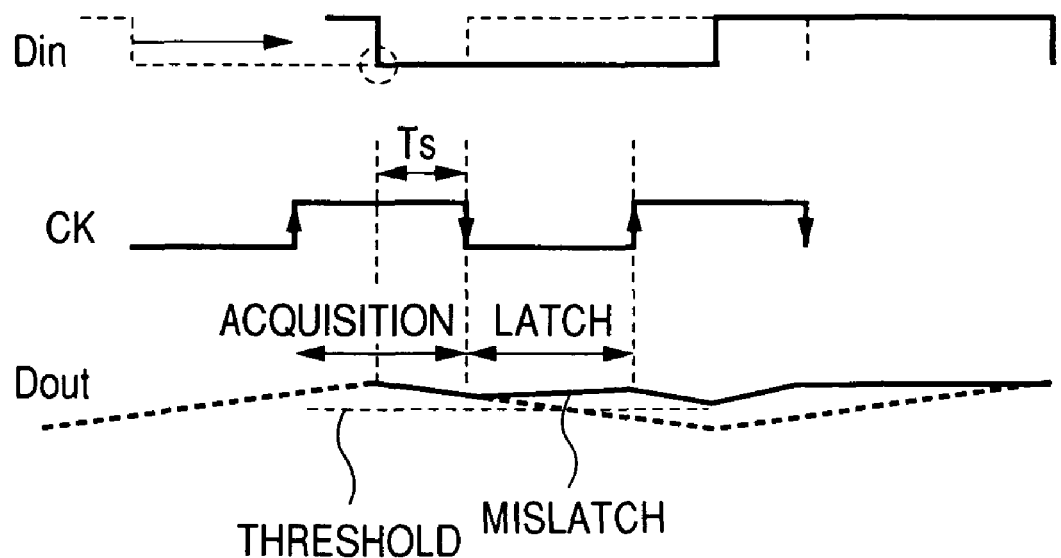

Therefore, as shown in FIG. 5B, even if the data input signal Din is delayed, the data output signal Dout is properly latched by the latch part LT unlike in FIG. 12B. In other words, the setup margin is increased by (Trf11–Trf4) compared with the latch circuit DLT_C of FIG. 10. This allows the logic circuit to operate at a higher speed.

Figure 6:
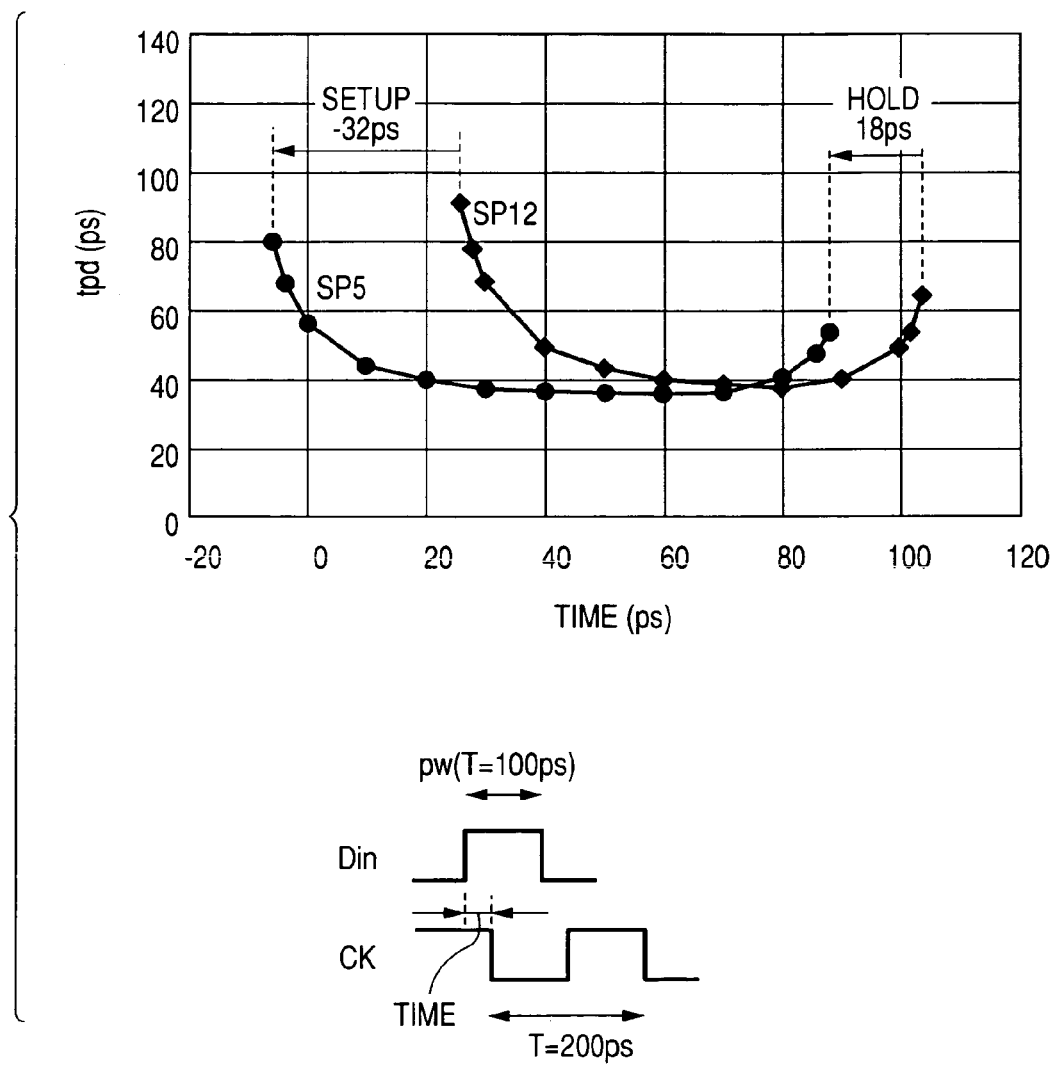
FIG. 6 is a graph showing simulation results of the setup hold characteristic in a case where the latch circuit of FIG. 2 is applied to a flip-flop circuit and a case where a latch circuit of FIG. 10A is applied to a flip-flop circuit.
Figure 10A:
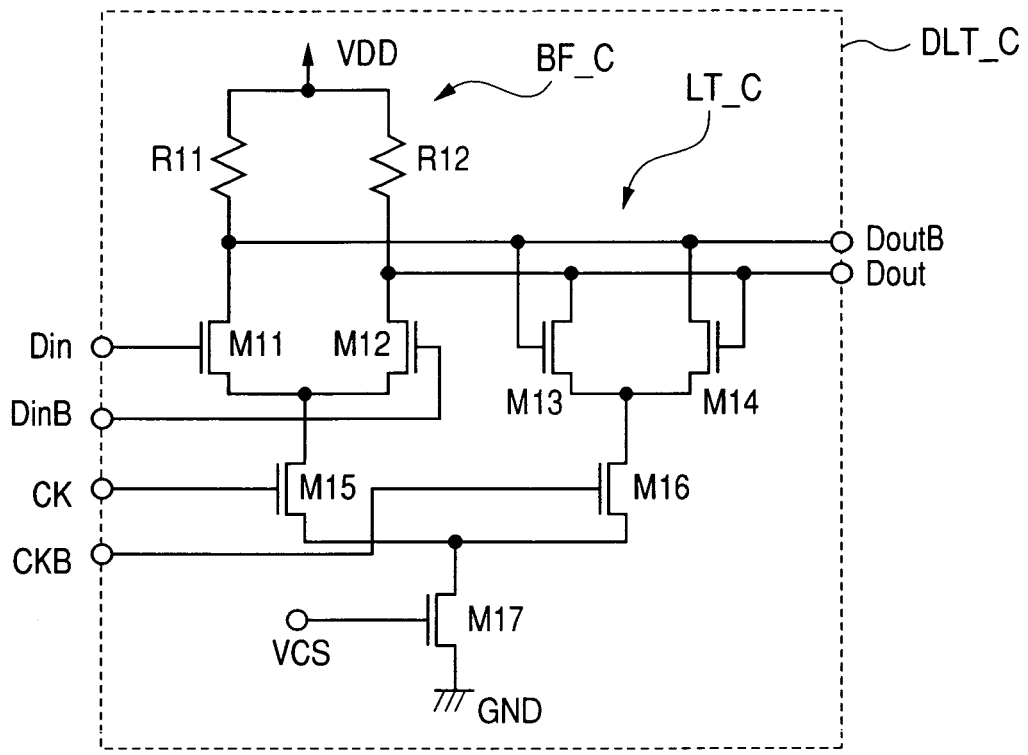
FIGS. 10A and 10B show a configuration example of a logic circuit considered as a base of the present invention.
Figure 10B:
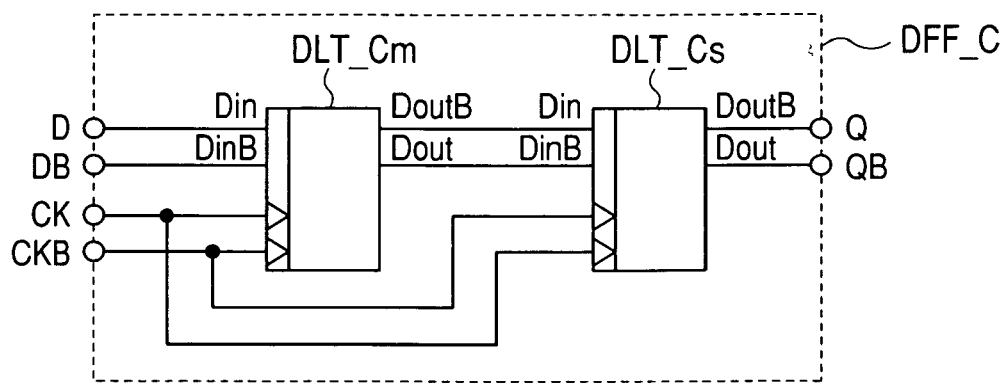
Figure 11A:
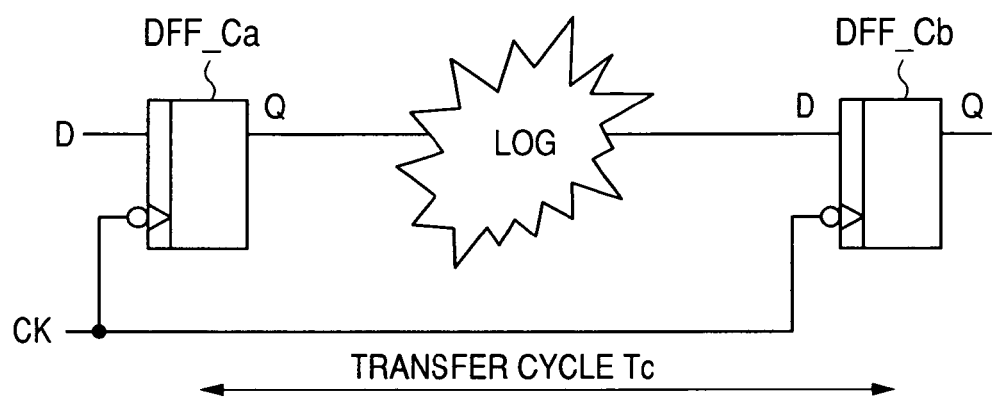
FIGS. 11A and 11B show data transfer between flip-flop circuits of FIG. 10B.
Figure 11B:
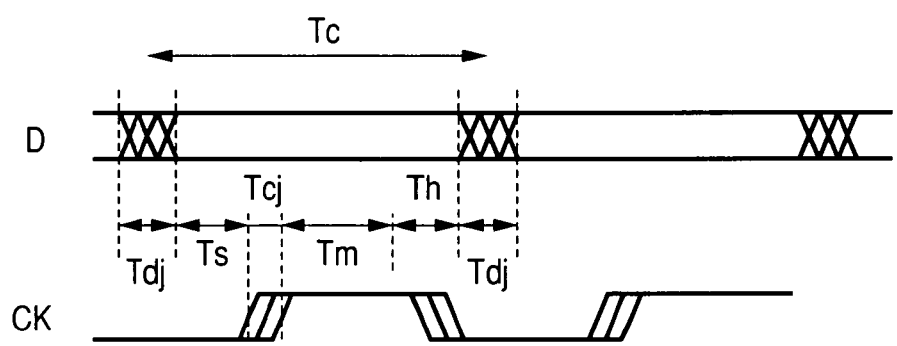

FIG. 6 is a graph showing simulation results of the setup hold characteristic in a case where the latch circuit of FIG. 2 is applied to a flip-flop circuit and a case where the latch circuit of FIG. 10A is applied to a flip-flop circuit. A characteristic SP5 of FIG. 6 is a result in a case where latch circuits DLT of FIG. 2 constitute a master-slave flip-flop circuit as shown in FIG. 10B, and a characteristic SP12 is a result in a case where latch circuits DLT_C of FIG. 10A constitute a master-slave flip-flop circuit as shown in FIG. 10B.

Here, as shown in FIG. 6, the clock signal CK having a cycle of 200 ps (5 GHz) and the data input signal Din (data rate 10 GHz) having a pulse width of 100 ps were used, and an evaluation was made while changing the time between the start edge of the Din and the falling edge of the CK. If the point of time when both the edges are matched is defined as a time "0", the time "0" means that the setup time is set to "0" and the hold time determined by the end edge of the Din and the falling edge of the CK is set to "100 ps." On the other hand, if the time is extended to "100 ps," the time "100 ps" means that the setup time is set to "100 ps" and the hold time is set to "0."

The simulations were performed in this way. As shown in FIG. 6, an operation started from near the time "–7 ps" in the case of the characteristic SP5, while an operation started from near the time "25 ps" in the case of the characteristic SP12. This means that use of the latch circuit of FIG. 2 increased the setup margin by 32 ps compared with use of the latch circuit of FIG. 10. For convenience, the description has been made assuming that the point of time when the start edge of the Din and the falling edge of the CK are matched is the time "0." However, a slightly shifted point of time was set to the time "0" in the simulation. As a result, an operation started from approximately the time "–7 ps" in the case of the SP5. As described above, the setup margin is increased by as much as 32 ps with respect to a data rate of 100 ps. Thus, 10 Gbps-class data communications are surely realized and further high-speed data communications can be supported.

As described above, use of the logic circuit according to the first embodiment speeds up operations of various logic circuits including a latch circuit, a flip-flop circuit, and the like.

Second Embodiment

In a second embodiment of the present invention, a configuration example in a case in which the above-mentioned latch circuit of FIG. 1 or FIG. 2 is applied to such as a flip-flop circuit for high-speed serial communications will be described. For example, in 10 Gbps-class high-speed serial communications, a mode called as "half rate" or the like is frequently used in consideration of a reduction in power consumption, securing of the timing margin, or the like. In half rate mode, for example, with respect to a data input signal of 10 Gbps, a data input signal is acquired using the rising edge and the falling edge of a clock signal of 5 GHz, which is half the 10 Gbps signal. Such a mode may be called "double data rate mode."

Figure 7A:
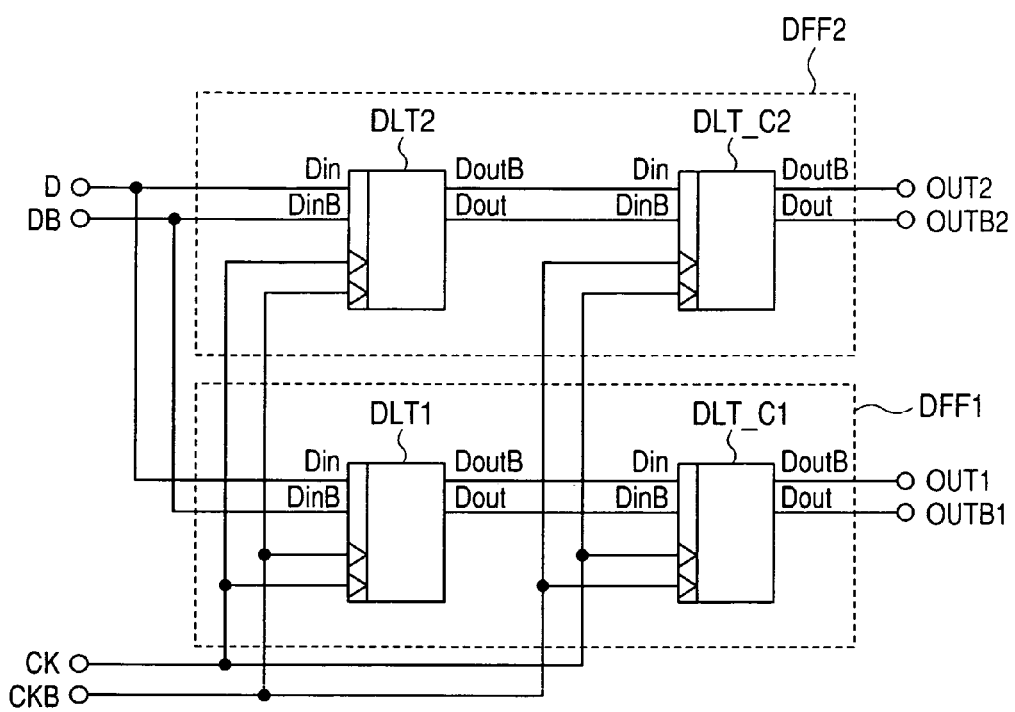
FIGS. 7A and 7B show a logic circuit according to the second embodiment.
Figure 7B:
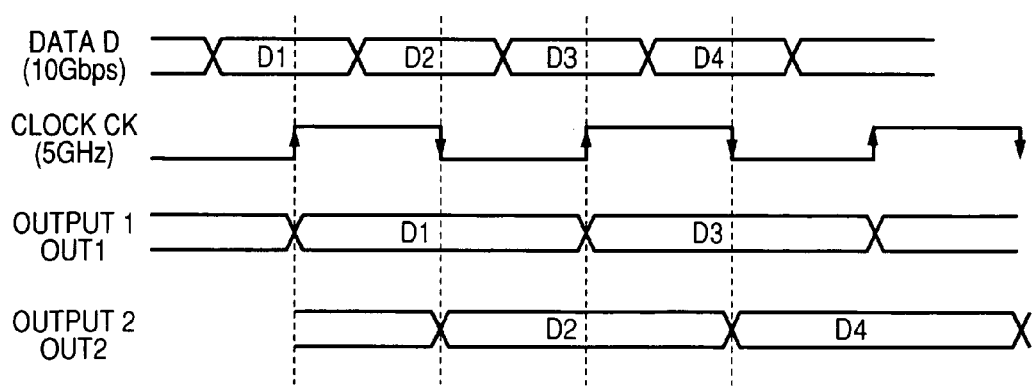

FIGS. 7A and 7B show a logic circuit according to the second embodiment. FIG. 7A is a circuit diagram showing a configuration example of the logic circuit and FIG. 7B is a waveform diagram showing an operation example of the logic circuit. The logic circuit of FIG. 7A includes two flip-flop circuits DFF1 and DFF2, each of which is a master-slave flip-flop circuit. The DFF1 includes a master (front) latch circuit DLT1 and a slave (rear) latch circuit DLT_C1. Similarly, the DFF2 includes a master (front) latch circuit DLT2 and a slave (rear) latch circuit DLT_C2.

In this logic circuit, complementary data input signals D and DB and complementary clock signals CK and CKB are to be inputted into the flip-flop circuits DFF1 and DFF2. Complementary data output signals OUT1 and OUTB1 are to be outputted from the DFF1, and complementary data output signals are to be outputted from the DFF2. Here, the latch circuit of FIG. 1 or FIG. 2 is applied to each of the master latch circuits DLT1 and DLT2, and, for example, the latch circuit DLT_C of FIG. 10 is applied to each of the slave latch circuits DLT_C1 and DLT_C2.

The flip-flop circuits DFF1 and DFF2 operate reversely to each other with respect to the phase of the clock signal. For example, the DLT1 acquires the data input signals D and DB when the clock signal CK is an "L" level, and it latches the D and DB when the clock signal CK is an "H" level. On the other hand, the DLT2 acquires the D and DB when the clock signal CK is an "H" level, and it latches the D and DB when the clock signal CK is an "L" level. Therefore, as shown in FIG. 7B, the DFF1 operates as a rising edge trigger flip-flop circuit, while the DFF2 operates as a falling edge trigger flip-flop circuit.

In FIG. 7B, the flip-flop circuits DFF1 and DFF2 are each acquiring the data input signal D of 10 Gbps serial-transferred in the order of D1, D2, D3, and D4, using the rising edge and the falling edge of the clock signal CK of 5 GHz. By matching the rising edge of the CK with the D1 and D3 and matching the falling edge thereof with the D2 and D4, the D1 and D3 are outputted from the OUT1 serving as an output of the DFF1 at a data rate of 5 Gbps, and the D2 and D4 are outputted from the OUT2 serving as an output of the DFF2 at a data rate of 5 Gbps.

As described above, by converting a data rate of 10 Gbps into that of 5 Gbps, processes to be performed by various logic circuits located after the OUT1 and OUT2 are performed in synchronization with only either edge of the clock signal CK of 5 Gbps. Therefore, use of half rate mode allows a reduction in power consumption because half rate mode halves the clock frequency, as well as makes it easy to secure the timing margin.

In FIG. 7A, the master latch circuits DLT1 and DLT2 of the flip-flop circuits DFF1 and DFF2, respectively, each have the configuration of FIG. 1 or FIG. 2. This is because these master latch circuits must acquire the data input signal D of 10 Gbps and therefore must reliably operate even with a short setup time. On the other hand, the slave latch circuits DLT_C1 and DLT_C2 of the DFF1 and DFF2, respectively, each have the configuration of FIG. 10A. This is because the data acquisition part BF_C of the latch circuit DLT_C of FIG. 10A sufficiently secures the setup margin since it acquires the data latched by the master, and because the setup margin of the next stage is sufficiently secured even if the rise time/fall time of an output of the BF_C is lengthened. In other words, a delay in an input (corresponding to the data input signal Din of FIG. 12B) to the next stage is reduced by speeding up an output of the BF_C, while no problem occurs even if the rise time/fall time of an output of the BF_C is lengthened, since the Din has a data rate of 5 Gbps.

As described above, by applying the configuration of FIG. 1 or FIG. 2 to only the master latch circuits in the flip-flop circuits using half rate mode, power consumption or the circuit area is reduced, compared with a case where such a configuration is also applied to the slave latch circuit. Also, as described with reference to FIG. 3, the gain in the configuration of FIG. 1 or FIG. 2 is essentially smaller than that in FIG. 10 or the like; therefore, it is preferable not to use the configuration of FIG. 1 or FIG. 2 in the slave latch circuit and to secure the gain.

Figure 8:
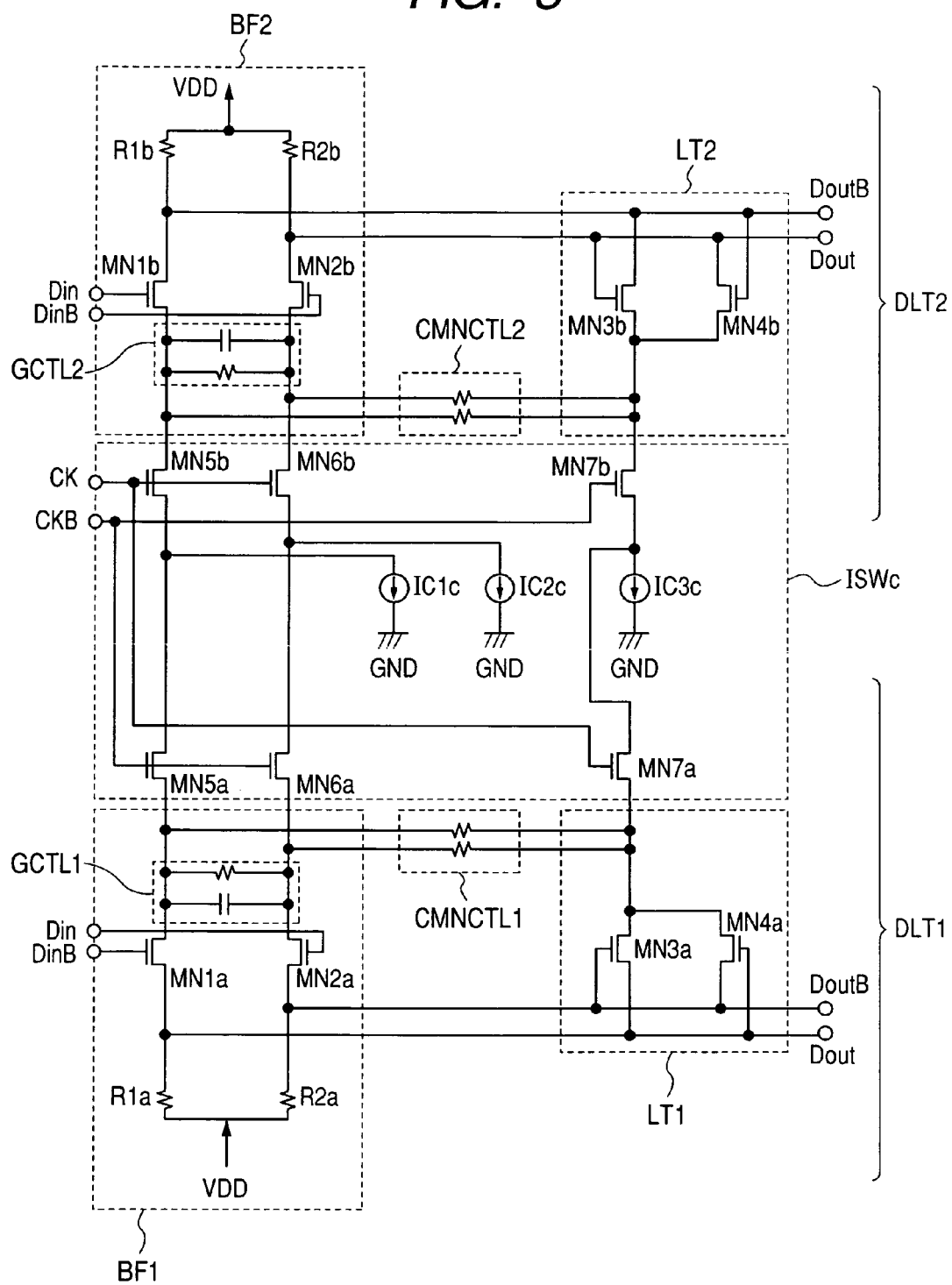
FIG. 8 is a circuit diagram showing detailed configuration examples of master parts of flip-flop circuits of FIG. 7.

FIG. 8 is a circuit diagram showing a detailed configuration example of the master latch circuits of the flip-flop circuits of FIG. 7. Specifically, FIG. 8 shows the latch circuits DLT1 and DLT2 of FIG. 7. The DLT1 and DLT2 include data acquisition parts BF1 and BF2, latch parts LT1 and LT2, common node control parts CMNCT1 and CMNCT2, respectively, each of which has a configuration similar to that shown in FIG. 2. The DLT1 and DLT2 also jointly include a common current switching part ISWc that is slightly different from what is shown in FIG. 2. The configuration except for the current switching part ISWc is similar to that shown in FIG. 2 and will not be described in detail.

The current switching part ISWc includes constant-current circuits IC1c to IC3c, NMOS transistors MN5a to MN7a and MN5b to MN7b. The MN5a and MN6a correspond to the MN5 and MN6, respectively, of FIG. 2, and the gates thereof are coupled to the inverted clock node CKB and the drains thereof are coupled to the data acquisition part BF1. Similarly, the MN5b and MN6b correspond to the MN5 and MN6, respectively, of FIG. 2, and the gates thereof are coupled to the clock node CK and the drains thereof are coupled to the data acquisition part BF2. The sources of the MN5a and MN5b are coupled to a common node, to which the constant-current circuit IC1c corresponding to the constant-current circuit IC1 of FIG. 2 is coupled. Similarly, the sources of the MN6a and MN6b are coupled to a common node, to which the constant-current circuit IC2c corresponding to the constant-current circuit IC2 of FIG. 2 is coupled.

The MN7a corresponds to the MN7 or MN8 of FIG. 2, and the gate thereof is coupled to the clock node CK and the gate thereof is coupled to the latch part LT1. The MN7b also corresponds to the MN7 or MN8 of FIG. 2, and the gate thereof is coupled to the inverted clock node CKB and the gate thereof is coupled to the latch part LT2. The sources of the MN7a and MN7b are coupled to a common node, to which the constant-current circuit IC3c is coupled. The current set values of the constant-current circuits IC1c and IS2c are identical, and the current set value of the constant-current circuit IC3c is, for example, twice the former (2×IC1c).

In the current switching part ISWc, when the clock signal CK is an "H" level, the constant-current circuits IC1c and IC2c are coupled to the data acquisition part BF2 of the latch circuit DLT2 and the constant-current circuit IC3c is coupled to the latch part LT1 of the latch circuit DLT1. On the other hand, when the clock signal CK is an "L" level, the constant-current circuits IC1c and IC2c are coupled to the data acquisition part BF1 of the latch circuit DLT1 and the constant-current circuit IC3c is coupled to the latch part LT2 of the latch circuit DLT2.

If the configuration of FIG. 2 is simply applied to the latch circuits DLT1 and DLT2, the current switching part needs four constant-current circuits and eight NMOS transistors. However, if the configuration of FIG. 8 is used, a desired operation is realized by providing three constant-current circuits and six NMOS transistors in the current switching part ISWc. This allows a reduction in circuit area, or the like.

As described above, use of the logic circuit (flip-flop circuit) according to the second embodiment allows the converted part of the data rate in half rate mode to sufficiently correspond to a high-speed operation, thereby allowing the logic circuit to operate at a higher speed. Further, the converted part of the data rate realizes lower power consumption or a smaller circuit area.

Third Embodiment

Figure 9:
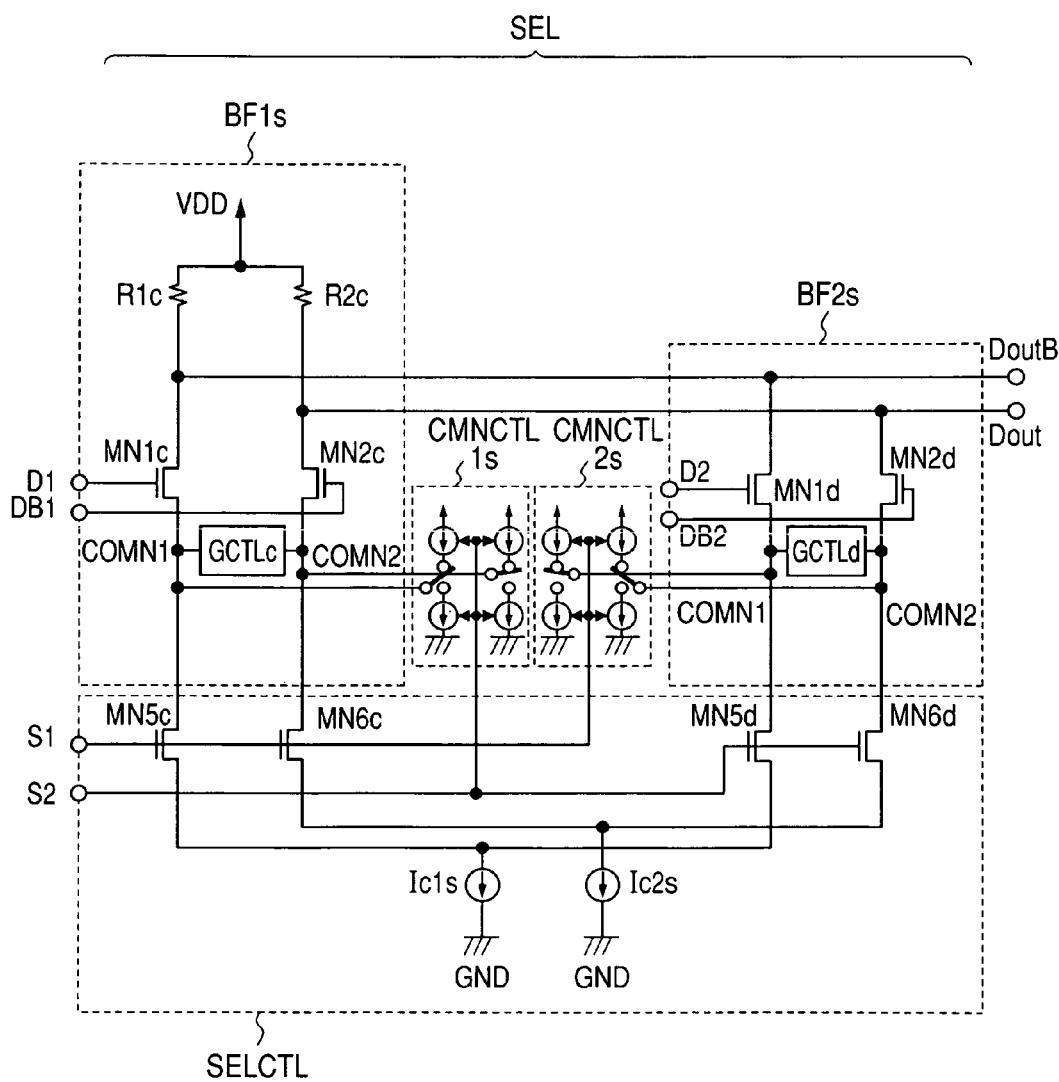
FIG. 9 is a circuit diagram showing a configuration example of a logic circuit according to a third embodiment of the present invention.

In a third embodiment of the present invention, a configuration example in a case where the above-mentioned latch circuit of FIG. 1 is applied to a selector circuit will be described. FIG. 9 is a circuit diagram showing a configuration example of a logic circuit according to the third embodiment. The logic circuit shown in FIG. 9 is a 2:1 selector circuit SEL.

The selector circuit SEL includes two data acquisition parts BF1s and BF2s, a selector switching part SELCTL, and two common node control parts CMNCTL1s and CMNCTL2s. As with the data acquisition part BD of FIG. 1, the data acquisition part BF1s includes NMOS transistors MN1c and MN2c, load circuits (load resistances) R1c and R2c, and a gain control part GCTLc. One of two inputs, data input signal D1, is inputted into the gate of the MN1c, and an inverted data input signal DB1 serving as an inverted signal of the D1 is inputted into the gate of the MN2c. As in FIG. 1, the common node control part CMNCTL1s is coupled to the common nodes COMN1 and COMN2 that are both ends of the gain control part GCTLc.

On the other hand, the data acquisition part BF2s includes NMOS transistors MN1d and MN2d, and a gain control part GCTLd. The BF2s also has a configuration substantially similar to that of the data acquisition part BF of FIG. 1. That is, the drain of the MN1d in the BF2s and the drain of the MN1c in the BF1s are jointly coupled to the inverted data output node DoutB, and the drain of the MN2d in the BF2s and the drain of the MN2c in the BF1s are jointly coupled to the data output node Dout, whereby the load resistances R1c and R2c are shared by the BF1s and BF2s. The other of the two inputs, data input signal D2, is inputted into the gate of the MN1d, and an inverted data input signal DB2 serving as an inverted signal of the D2 is inputted into the gate of the MN2d. As with the BF1s, the common node control part CMNCTL2s is coupled to the common nodes COMN1 and COMN2 that are both ends of the gain control part GCTLd.

The selector switching control part SELCTL has a configuration similar to that of the current switching part ISW of FIG. 1 and includes NMOS transistors MN5c, MN6c, MN5d, an MN6d and constant-current circuits IC1s and IC2s. As with the MN5 and MN6 of FIG. 1, the drains of the MN5c and MN6c are coupled to the BF1s, and the gates thereof are coupled to a first select node (first select signal) S1. Similarly, the drains of the MN5d and MN6d are coupled to the BF2s and the gates thereof are coupled to a second select node (second select signal) S2. The sources of the MN5c and MN5d are jointly coupled to the constant-current circuit IC1s, and the sources of the MN6c and MN6d are jointly coupled to the constant-current circuit IC2s.

In the selector circuit SEL, when the first select signal S1 is selected, the data acquisition part BF1s is activated so that the data input signal D1 and DB1 are acquired by the BF1s and so that these pieces of data are outputted to the data output nodes Dout and DoutB. Also, when the first select signal S1 is selected, the common node control part CMNCTL2s is activated so that the common nodes COMN1 and COMN2 in the data acquisition part BD2s are stabilized, as described in the first embodiment. On the other hand, if the second select signal S2 is selected, the data acquisition part BF2s is activated so that the data input signal D2 and DB2 are acquired by the BF2s and so that these pieces of data are outputted to the data output nodes Dout and DoutB. Also, when the second select signal S2 is selected, the common node control part CMNCTL1s is activated so that the common nodes COMN1 and COMN2 in the data acquisition part BF1s are stabilized.

As with the first embodiment, use of the selector circuit SEL as described above allows shortening of the rise time/fall time of the data output signal when a high-speed data input signal is received. Thus, the logic circuit (selector circuit) is speeded up. While the 2:1 selector circuit is used as an example herein, a similar advantage is obtained also in an n:1 (n≧3) selector, as a matter of course.

While the present invention has been described in detail on the basis of the embodiments, the invention is not limited thereto. Various modifications can be made to these embodiments without departing from the spirit and scope of the invention.

For example, the MOS transistors are used as transistors in the embodiments; however, these MOS transistors may be replaced with bipolar transistors or the like.

The logic circuit according to the present invention is an effective technology applicable to, for example, a flip-flop circuit for use in a large-scale integrated circuit (LSI) for high-speed communications. Further, without being limited to this, this logic circuit is widely applicable to various logic circuits that are required to operate at higher speeds, such as flip-flop circuits and selector circuits.

What is claimed is:

1. A logic circuit comprising:
    a data acquisition part including a transistor pair, the transistor pair operating differentially, the data acquisition part, when a clock signal is a first level, acquiring a data input signal inputted into the transistor pair, and amplifying the acquired data using a first gain and outputting the amplified data to a data output node;
    a latch part that latches the data outputted to the data output node when the clock signal is a second level;
    a gain control part provided between the a first common node of a first transistor, the first transistor being one of transistors forming the transistor pair, and a second common node of a second transistor, the second transistor being the other of the transistors forming the transistor pair, the gain control part making the first gain in a high frequency band higher than the first gain in a low frequency band; and
    a common node control part coupled to the first and second common nodes, the common node control part, when the clock signal is a second level, performing control such that a potential difference between the first and second common nodes is eliminated by providing or drawing electric charge to or from the first and second common nodes.

2. The logic circuit according to claim 1, wherein the gain control part includes a resistance and a capacitance that are parallel-coupled.

3. The logic circuit according to claim 1, further comprising
    a master-slave flip-flop circuit in which an input of a second latch circuit serving as a slave is coupled to an output of a first latch circuit serving as a master, wherein the data acquisition part and the latch part are included in each of the first and second latch circuits, and wherein the gain control part is included only in the first latch circuit.

4. The logic circuit according to claim 3, wherein the flip-flop circuit uses, with respect to the data input signal having a first speed, the clock signal having a second speed that is half the first speed and latches every other pieces of serial data in the data input signal using one edge of the clock signal having the second speed.

5. A logic circuit comprising:

a first transistor and a second transistor to each of control input nodes of which a data input signal and an inverted data input signal are inputted;

a first load circuit coupled to a first node of the first transistor;

a second load circuit coupled to a first node of the second transistor;

a third transistor to a first node of which the first node of the first transistor is coupled and to a control input node of which the first node of the second transistor is coupled;

a fourth transistor to a first node of which the first node of the second transistor is coupled, to a control input node of which the first node of the first transistor is coupled, and to a second node of which a second node of the third transistor is jointly coupled;

a fifth transistor a first node of which is coupled to a second node of the first transistor and to a control input node of which a clock signal is inputted;

a sixth transistor a first node of which is coupled to a second node of the second transistor and to a control input node of which the clock signal is inputted;

a seventh transistor a first node of which is coupled to a second node of the third transistor and to a control input node of which an inverted clock signal is inputted;

an eighth transistor a first node of which is coupled to a second node of the fourth transistor and to a control input node of which the inverted clock signal is inputted;

a first constant-current circuit jointly coupled to a second node of the fifth transistor and a second node of the seventh transistor;

a second constant-current circuit jointly coupled to a second node of the sixth transistor and a second node of the eighth transistor;

a first resistance and a first capacitance provided between the second node of the first transistor and the second node of the second transistor in a manner that the first resistance and the first capacitance are parallel-coupled; and a common node control part, the common node control part, upon receipt of the inverted clock signal, providing or drawing electric charge to or from the second node of the first transistor and the second node of the second transistor so as to eliminate a potential difference between the second node of the first transistor and the second node of the second transistor.

6. The logic circuit according to claim 5, wherein the common node control part includes:

a second resistance coupled between the second node of the first transistor and the second node of the third transistor; and a third resistance coupled between the second node of the second transistor and the second node of the third transistor.

* * * * *